(12) United States Patent
Hoenk et al.

(10) Patent No.: US 10,078,142 B2
(45) Date of Patent: Sep. 18, 2018

(54) SENSOR INTEGRATED METAL DIELECTRIC FILTERS FOR SOLAR-BLIND SILICON ULTRAVIOLET DETECTORS

(71) Applicant: California Institute of Technology, Pasadena, CA (US)

(72) Inventors: Michael E. Hoenk, Valencia, CA (US); John J. Hennessy, Los Angeles, CA (US); Shouleh Nikzad, Valencia, CA (US); April D. Jewell, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

Patent file contains an affidavit/declaration under 37 CFR 1.130(b).

(21) Appl. No.: 15/019,863

(22) Filed: Feb. 9, 2016

(65) Prior Publication Data

US 2016/0273958 A1 Sep. 22, 2016

Related U.S. Application Data

(60) Provisional application No. 62/113,658, filed on Feb. 9, 2015.

(51) Int. Cl.
*G01T 1/20* (2006.01)
*H01L 31/107* (2006.01)
(Continued)

(52) U.S. Cl.
CPC ............ *G01T 1/2018* (2013.01); *G01T 1/244* (2013.01); *G01T 1/2985* (2013.01);
(Continued)

(58) Field of Classification Search
None
See application file for complete search history.

(56) References Cited

U.S. PATENT DOCUMENTS 4,158,133 A * 6/1979 Spaeth .................. G02B 5/288
136/257
4,614,871 A 9/1986 Driscoll
(Continued)

FOREIGN PATENT DOCUMENTS

WO 2013111844 8/2013

OTHER PUBLICATIONS

Hennessy, J., et al., Metal-dielectric filters for solar-blind silicon ultraviolet detectors. Applied Optics, Apr. 10, 2015, vol. 54, No. 11, pp. 3507-3512.
(Continued)

*Primary Examiner* — Edwin Gunberg
(74) *Attorney, Agent, or Firm* — Gates & Cooper LLP

(57) ABSTRACT

A filter for electromagnetic radiation including one or more dielectric spacer regions and one or more reflective regions integrated on a semiconductor substrate, the semiconductor substrate including a semiconductor photodetector, such that the filter transmits ultraviolet radiation to the semiconductor photodetector, the ultraviolet radiation having a range of wavelengths, and the filter suppresses transmission of electromagnetic radiation, having wavelengths outside the range of wavelengths, to the semiconductor photodetector.

20 Claims, 10 Drawing Sheets

(51) Int. Cl.
| | |
|---|---|
| *H01L 31/102* | (2006.01) |
| *G01T 1/24* | (2006.01) |
| *G01T 1/29* | (2006.01) |
| *H01L 27/146* | (2006.01) |
| *H01L 27/148* | (2006.01) |

(52) U.S. Cl.
CPC .. *H01L 27/14621* (2013.01); *H01L 27/14685* (2013.01); *H01L 31/102* (2013.01); *H01L 31/107* (2013.01); *H01L 27/148* (2013.01); *H01L 27/14643* (2013.01)

(56) References Cited

U.S. PATENT DOCUMENTS

| | | | | |
|---|---|---|---|---|
| 5,376,810 | A | * | 12/1994 | Hoenk ............... H01L 27/148 257/228 |
| 5,763,063 | A | | 6/1998 | Pass et al. |
| 5,773,829 | A | | 6/1998 | Iwanczyk et al. |
| 7,138,633 | B1 | * | 11/2006 | Rozsa ................ G01T 1/1648 250/361 R |
| 8,395,243 | B2 | | 3/2013 | Hoenk |
| 8,680,637 | B2 | | 3/2014 | Hoenk et al. |
| 2004/0159793 | A1 | | 8/2004 | Brabec et al. |
| 2007/0029493 | A1 | | 2/2007 | Kniss et al. |
| 2009/0159785 | A1 | | 6/2009 | Tsang |
| 2009/0261259 | A1 | | 10/2009 | Yip |
| 2010/0314546 | A1 | | 12/2010 | Ronda |
| 2011/0079728 | A1 | | 4/2011 | Garcia et al. |
| 2011/0204463 | A1 | | 8/2011 | Grand |
| 2015/0276947 | A1 | | 10/2015 | Hoenk et al. |
| 2016/0035914 | A1 | * | 2/2016 | Deliwala ........... H01L 31/02327 257/432 |

OTHER PUBLICATIONS

Hoenk, M., et al., Delta-doped back-illuminated CMOS imaging arrays: Progress and prospects. Proc. of SPIE. 2009, vol. 7419, 74190T, pp. 74190T-1-74190T-5.
PCT International Search Report and Written Opinion dated Jun. 10, 2016, International Application No. PCT/US16/17200.
PCT Notification Concerning Transmittal of International Preliminary Report on Patentability, PCT/US2015/022853, dated Oct. 6, 2016.
Hamden, E.T., et al., "Ultraviolet antireflection coatings for use in silicon detector design", Applied Optics, Jul. 20, 2011, pp. 4180-4188, vol. 50, No. 21.
Hoenk, M.E., et al., "Superlattice-doped silicon detectors: progress and prospects", Proc. of SPIE, Jul. 2014, pp. 915413-1-915413-13, vol. 9154.
Greer, F., et al., "Atomically precise surface engineering of silicon CCDs for enhanced UV quantum efficiency", J. Vac. Sci. Technol. A., Jan./Feb. 2013, pp. 01A103-1-01A103-9, vol. 31, No. 1.
Rakic, A.D., et al., "Optical properties of metallic films for vertical-cavity optoelectronic devices", Applied Optics, Aug. 1, 1998, pp. 5271-5283, vol. 37, No. 22.
Jewell, A.D., et al., "Wide Band Antireflection Coatings Deposited by Atomic Layer Deposition", Proc. of SPIE, 2013, pp. 88200Z-1-88200Z-9, vol. 8820.

Berning, P.H., et al., "Induced Transmission in Absorbing Films Applied to Band Pass Filter Design", Journal of the Optical Society of America, Mar. 1957, pp. 230-239, vol. 47, No. 3.
Lim, P.L., et al., "WFPC2 Filters after 16 Years on Orbit", Space Telescope Science Institute, Instrument Science Report WFPC2, May 2010, pp. 1-15.
Mu, J., et al., "Design and fabrication of a high transmissivity metal-dielectric ultraviolet band-pass filter", Applied Physics Letters, 2013, pp. 213105-1-213105-3, vol. 102.
Roming, P.W.A., et al., "The Swift Ultra-Violet/Optical Telescope", Space Science Reviews, 2005, pp. 95-142, vol. 120.
Trauger, J.T., "Sensors for the Hubble Space Telescope Wide Field and Planetary Cameras (1 and 2)", Astronomical Society of the Pacific, 1990, pp. 217-230.
Bloemer, M.J., et al., "Transmissive properties of Ag/MgF2 photonic band gaps", Applied Physics Letters, Apr. 6, 1998, pp. 1676-1678, vol. 72, No. 14.
Piegari, A., et al., "Variable narrowband transmission filters with a wide rejection band for spectrometry", Applied Optics, Jun. 1, 2006, pp. 3768-3773, vol. 45. No. 16.
Sigalas, M.M., et al., "Metallic photonic band-gap materials", Physical Review B, Oct. 15, 1995, pp. 11 744-11 751, vol. 52, No. 16.
Renk, K.F., et al., "Interference Filters and Fabry-Perot Interferometers for the Far Infrared", Applied Optics, Sep. 1962, pp. 643-648, vol. 1, No. 5.
Scalora, M., et al., "Transparent, metallo-dielectric, one-dimensional, photonic band-gap structures", Journal of Applied Physics, Mar. 1, 1998, pp. 2377-2383, vol. 83, No. 5.
Hoenk, M.E., et al., "Growth of a delta-doped silicon layer by molecular beam epitaxy on a charge-coupled device for reflection-limited ultraviolet quantum efficiency", Appl. Phys. Lett., Aug. 31, 1992, pp. 1084-1086, vol. 61, No. 9.
Nikzad, S., et al., "Delta-doped electron-multiplied CCD with absolute quantum efficiency over 50% in the near to far ultraviolet range for single photon counting applications", Applied Optics, Jan. 20, 2012, pp. 365-369, vol. 51, No. 3.
Stecher, T.P., et al., "The Ultraviolet Imaging Telescope: Design and Performance", The Astrophysical Journal, Aug. 10, 1992, pp. L1-L4, vol. 395.
Frey, L., et al., "Color filters including infrared cut-off integrated on CMOS image sensor", Optics Express, Jul. 4, 2011, pp. 13073-13080, vol. 19, No. 14.
Jaksic, Z., et al., "Silver-silica transparent metal structures as bandpass filters for the ultraviolet range", Journal of Optics A: Pure and Applied Optics, 2005, pp. 51-55, vol. 7.
Baumeister, P.W., et al., "Bandpass Filters for the Ultraviolet", Applied Optics, Aug. 1965, pp. 911-914, vol. 4, No. 8.
Bates, B., et al., "Interference Filters for the Far Ultraviolet (1700 A to 2400 A)", Applied Optics, Jun. 1966, pp. 971-975, vol. 5., No. 6.
Hamamatsu brochure for MPPC Modules, Selection guide—Jan. 2014.
TFCalc: Thin Film Design Software for Windows, Version 3.5, Software Spectra, Inc. (2009).
Palik, E.D.,, Handbook of Optical Constants of Solids III (Academic, 1998).
PCT Notification Concerning Transmittal of International Preliminary Report on Patentability (IPRP), dated Aug. 24, 2017, PCT International Application No. PCT/US2016/017200.

\* cited by examiner

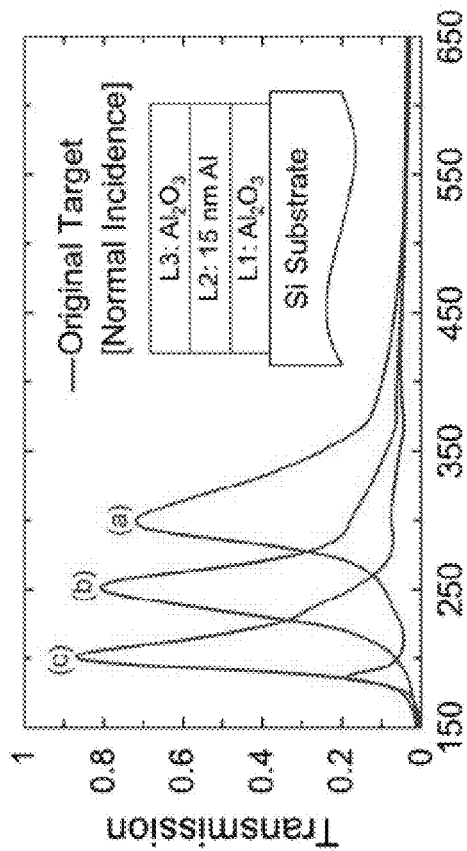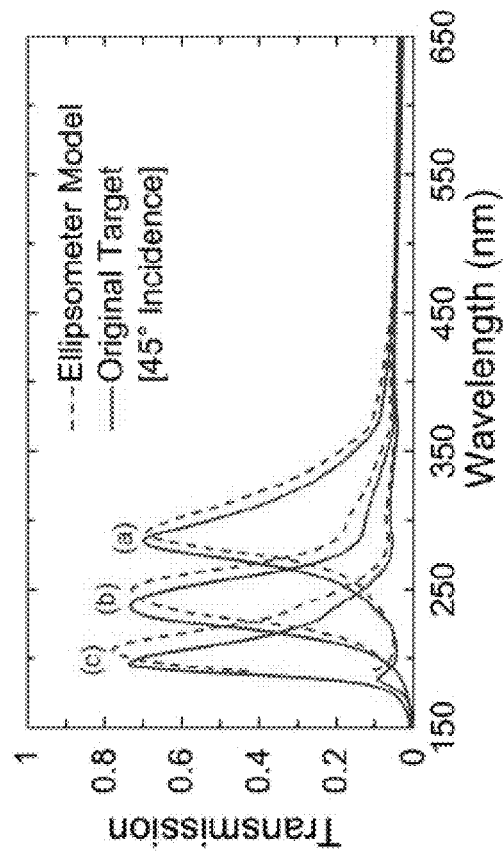
Fig. 5A
Fig. 5B

SENSOR INTEGRATED METAL DIELECTRIC FILTERS FOR SOLAR-BLIND SILICON ULTRAVIOLET DETECTORS

CROSS REFERENCE TO RELATED APPLICATIONS

This application claims the benefit under 35 U.S.C. Section 119(e) of commonly-assigned U.S. Provisional Patent Application Ser. No. 62/113,658, filed on Feb. 9, 2015, by Michael E. Hoenk, John J. Hennessy, Shouleh Nikzad, and April D. Jewell, entitled "SENSOR INTEGRATED METAL DIELECTRIC FILTERS FOR SOLAR-BLIND SILICON ULTRAVIOLET DETECTORS," which application is incorporated by reference herein.

This application is related to U.S. patent application Ser. No. 14/670,365 filed on Mar. 26, 2015, by Michael E. Hoenk, John Hennessy, and David Hitlin, entitled "SUBNANOSECOND SCINTILLATION DETECTOR," which application claims the benefit under 35 U.S.C. Section 119(e) of U.S. Provisional Patent Application Ser. No. 61/970,779, filed on Mar. 26, 2014, by Michael Hoenk and David Hitlin, entitled "SUBNANOSECOND SCINTILLATION DETECTOR," client reference number CIT-6868-P, which applications are incorporated by reference herein.

STATEMENT REGARDING FEDERALLY SPONSORED RESEARCH AND DEVELOPMENT

The invention described herein was made in the performance of work under a NASA contract NNN12AA01C, and is subject to the provisions of Public Law 96-517 (35 USC 202) in which the Contractor has elected to retain title.

BACKGROUND OF THE INVENTION

1. Field of the Invention

This invention relates to filters for detectors (e.g., semiconductor device detectors).

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

The detection of ultraviolet (UV) light has applications in planetary imaging and spectroscopy, astronomy, communications, and medical imaging/diagnostics. One major challenge facing UV detection is visible or solar rejection, as UV photons in bands of interest are often greatly outnumbered by visible photons, effectively reducing the signal-to-noise ratio. One approach to selective UV detection is the use of wide bandgap semiconductors. These materials are inherently insensitive to lower-energy photons, but device performance is typically limited by material quality issues that degrade quantum efficiency in the ultraviolet. Si sensors can be modified, through a technique invented at the Jet Propulsion Laboratory (JPL) called delta-doping, to have 100% internal quantum efficiency throughout the ultraviolet [1], but this high efficiency is maintained throughout the visible as well.

SUMMARY OF THE INVENTION

One or more embodiments of the invention disclose the fabrication of metal-dielectric thin film stacks deposited directly onto semiconductor (e.g., silicon) substrates for use as ultraviolet bandpass filters. Integration of these filters onto semiconductor (e.g., silicon) improves the admittance matching of the structure when compared to similar designs fabricated on transparent substrates, leading to higher peak transmission or improved out-of-band rejection if used with a semiconductor based (e.g., Si-based) sensor platform.

Thus, one or more embodiments of the invention disclose one or more filters for electromagnetic radiation, each of the filters comprising one or more dielectric spacer regions and one or more reflective regions integrated (e.g., grown) on a semiconductor substrate, the semiconductor substrate including a semiconductor photodetector, such that each of the filters transmit ultraviolet radiation to the semiconductor photodetector, the ultraviolet radiation having a range of wavelengths, and each of the filters suppress transmission of out-of-band electromagnetic radiation, having wavelengths outside the range of wavelengths, to the semiconductor photodetector.

The range of wavelengths can be 100 nm-300 nm and the wavelengths outside the range of wavelengths can include wavelengths corresponding to visible light and infrared radiation.

The filters can include a portion of the semiconductor substrate, forming photodetector integrated filters each comprising a Fabry-Perot cavity. The dielectric spacers can be transparent to the ultraviolet radiation and the reflective regions can be reflective for the out-of-band electromagnetic radiation. Each of the reflective regions can separate two of the dielectric spacer regions, and the reflective regions and the dielectric spacer regions can be structured to:

destructively phase-match reflection of the ultraviolet radiation off of the reflective regions so as to increase transmission of the ultraviolet radiation through the filter to the semiconductor photodetector, and increase reflection of the out-of-band electromagnetic radiation off of the reflective regions and away from the semiconductor photodetector.

The one or more dielectric spacer regions can comprise one or more dielectric layers with the first dielectric layer deposited directly on the semiconductor substrate or on an oxide of the semiconductor substrate. The one or more reflective regions can comprise one or more metal layers, each of the metal layers separating two of the dielectric layers.

Transparency of the dielectric layers to the ultraviolet radiation, a number of the dielectric layers, one or more thicknesses of the dielectric layers, a number of the metal layers, reflectivity of the metal layers, a refractive index of the semiconductor substrate, and an extinction coefficient of the semiconductor substrate can be controlled to achieve a desired transmittance:

for example, higher transmission for the ultraviolet radiation, and increased reflectivity of the out-of-band electromagnetic radiation, as compared to a filter comprising each of the metal layers separating two of the dielectric layers and deposited on a quartz substrate; and/or for example, measured transmission of the ultraviolet radiation and the out-of-band electromagnetic radiation by each of the filters within 10% of a calculated transmission of the ultraviolet radiation and the out of band electromagnetic radiation, the calculated transmission calculated using a simulation of one or more of the filters.

Thicknesses of the dielectric and/or metal layers can be adjusted to account for oxidation of one or more of the metal layers. The dielectric layers can each have a thickness in a range of 20-100 nm and the metal layers can each have a thickness in a range of 5-50 nm.

The dielectric spacer regions can consist of two dielectric layers and the reflective region can consist of a metal layer between the dielectric layers. The dielectric spacer regions can consist of three dielectric layers, the reflective regions can consist of two metal layers, and each of the metal layers can separate two of the dielectric layers. The dielectric spacer regions can consist of four dielectric layers, the reflective regions can consist of three metal layers, and each of the metal layers can separate two of the dielectric layers.

Test structures fabricated with metallic Al and atomic layer deposited $Al_2O_3$ were characterized with spectroscopic ellipsometry and agree well with optical models. These models predict transmission as high as 90% in the spectral range of 200-300 nanometers (nm) for simple three-layer coatings.

The dielectric spacer regions can comprise at least one dielectric selected from aluminum oxide, silicon dioxide, and magnesium fluoride, and the reflective regions comprise aluminum or a dielectric that reflects the electromagnetic radiation having wavelengths outside said range of wavelengths.

The semiconductor photodetector (e.g., avalanche photodiode) can include the MDF and a passivation layer comprising multiple doped layers configured to provide the semiconductor photodetector having a peak quantum efficiency (QE) greater than 40% for the ultraviolet radiation (e.g., at a wavelength of 225 nm).

A scintillator can be electromagnetically coupled to each of the filters, wherein the scintillators each emit scintillation comprising the ultraviolet radiation in response to interactions with energetic photons or particles.

One or more embodiments of the invention further disclose a system for performing Positron Emission Tomography (PET) comprising:

pairs of scintillators each comprising a first scintillator and a second scintillator, the first scintillator positioned to receive a first gamma photon and emit a first scintillation in response thereto, the second scintillator positioned to receive a second gamma photon and emit a second scintillation in response thereto, the first and second gamma photons emitted as a pair from an electron-positron annihilation, and the positron emitted by a radionuclide tracer introduced into a biological cell; and pairs of the filters, comprising a first filter and a second filter, the first filter positioned to receive the first scintillation and the second filter positioned to receive the second scintillation.

BRIEF DESCRIPTION OF THE DRAWINGS

Referring now to the drawings in which like reference numbers represent corresponding parts throughout:

FIG. 5A and FIG. 5B illustrate an optical model and layer structure for experimental MDF structures and the original target model at 45° incidence in comparison with the ellipsometrically predicted transmission at the same angle of incidence (AOI), according to one or more embodiments of the invention.

DETAILED DESCRIPTION OF THE INVENTION

Figure 1:
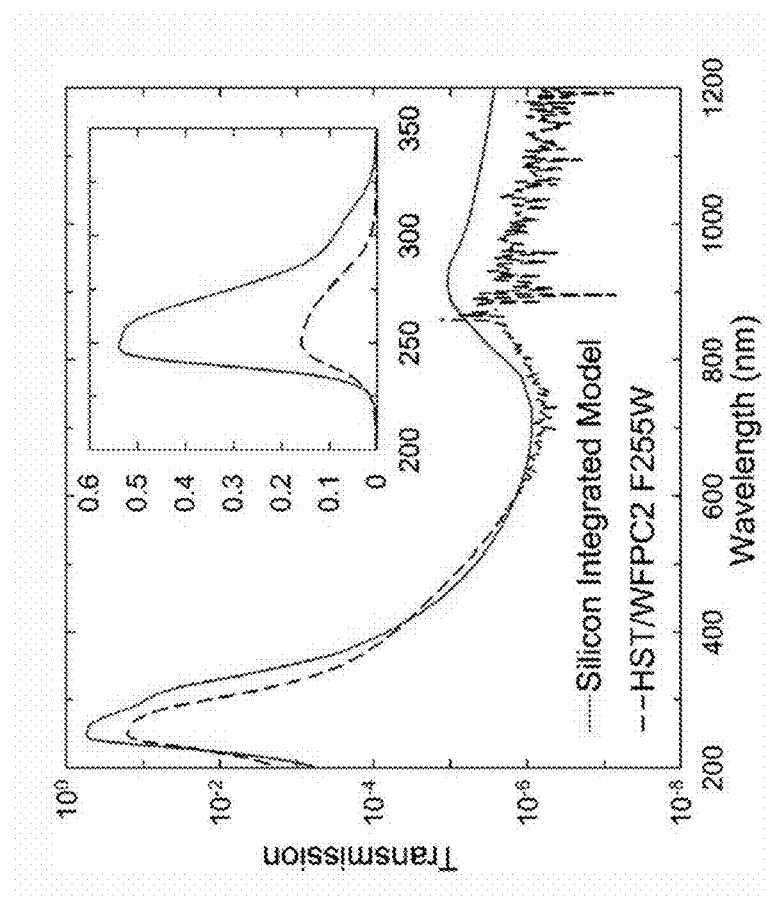
FIG. 1 is a comparison of the UV bandpass filter F255W in the Hubble Space Telescope's Wide-Field Planetary Camera 2 with the calculated performance of a nine-layer $Al/MgF_2$ filter structure on Si designed to match the out-of-band rejection performance according to one or more embodiments of the invention (inset shows transmission in the passband on a linear scale).

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

One or more embodiments of the present invention show that the concept of metal-dielectric bandpass filters can be extended for use directly on a semiconductor (e.g., silicon (Si)) photodetector, and can achieve superior transmission/rejection performance when compared to similar structures fabricated on transparent substrates as stand-alone filter elements. In this way, the concept of visible band rejection can be extended to a semiconductor (e.g., silicon) sensor platform for use in a narrow- to medium-band UV imager, or implemented with a stepped or wedged thickness structure for use in spectroscopy applications.

For example, when large out-of-band rejection is not required, simple three-layer dielectric-metal-dielectric (DMD) structures according to one or more embodiments of the invention are capable of a peak narrow-band transmittance of greater than 90% over the entire range of 100 to 300 nm, a significant improvement over the performance of simple dielectric-based antireflection (AR) coatings in the 100-300 nm spectral range. Due to the small and rapidly changing refractive index of Si in this wavelength range, single-layer dielectric AR coatings are only capable of providing transmittance in the range of 50%-60% [2]. Multilayer high-low dielectric stacks are required to produce peak transmittances greater than 80% [3].

The metal-dielectric filters (MDFs) implemented according to one or more embodiments of the invention, also known as Fabry-Perot filters or photonic bandgaps, have a long history of use as bandpass filters for spectral ranges from the ultraviolet to the infrared [4-7]. The basic concept consists of matched parallel reflecting plates separated by a transparent spacer layer in order to destructively phase-match the reflection off of one metal layer at a particular wavelength and maximize transmission through the structure. Out-of-band light is not subjected to the same interference and is rejected by the high natural reflectance of the stack. Absorption losses in the metal layer restrict the maximum transmission performance of the filter; therefore it is desirable to choose metals with a large k/n ratio (ratio of extinction coefficient (k) to refractive index (n)) in the band of interest. In the visible spectrum silver is the most typical choice [8,9]; in the ultraviolet, the primary choice is aluminum (Al) due to its high plasma frequency and relative lack of significant interband transitions in the ultraviolet spectral range.

Modeling Performance of Metal-Dielectric Layers on Silicon as Filters According to One or More Embodiments a. Al/MgF$_2$ Layers Significant work has been performed over the past several decades on the use of MDFs for ultraviolet applications [4, 10-12]. Stand-alone MDFs for the UV have also been used in space-based astronomy applications for many years, including use on the Ultraviolet Imaging Telescope [13], the Hubble Space Telescope [14], and the Swift Gamma Ray Burst Explorer [15]. These MDF implementations have been restricted to use on transparent substrates, typically as part of a filter wheel assembly. Although integrating MDF structures directly onto the sensor eliminates some of the flexibility of filter wheel approaches, the potential performance benefit and reduction in system complexity may be desirable for many applications.

For example, FIG. 1 shows a comparison between the F255W bandpass filter on the Hubble Space Telescope's Wide-Field Planetary Camera 2 (WFPC2) [16] and a simulation of a nine-layer Al/MgF$_2$ MDF on silicon that matches the rejection performance, but provides more than three times the peak transmission. At the WFPC2 detector (or an analogous Si sensor) the throughput losses would be even more significant due to additional reflection losses of approximately 50%, giving a theoretical integrated detector system an overall throughput advantage of at least 6× in this case.

This significant performance improvement for Si MDFs in the UV does not extend far into the visible part of the spectrum. Recent work has explored the use of MDFs integrated on Si CMOS sensors for use as color filters in visible camera systems, with the performance projected to be similar to the same filters deposited on glass substrates [17]. As shown in this disclosure, the expected performance improvement over transparent MDFs in the visible is less significant due to poorer admittance matching as well as the reduced reflectance of Si in this range.

b. Al/Al$_2$O$_3$ Layers

In this example, the choice of Al$_2$O$_3$ is attractive due to its inherent chemical stability with the metallic Al films that make up the remainder of the structure. This also simplifies the characterization and analysis of fabricated Al/Al$_2$O$_3$ multilayers because any oxidation of the metal Al layers can be considered part of the adjacent deposited oxide layers. The experimental results discussed in the next section focus on this material system for the near-UV range of 200-300 nm.

Optical simulations utilizing the transfer matrix method [19] were performed in order to compare the theoretical performance of Si-integrated MDFs with more traditional transparent MDFs on quartz substrates. Three (DMD), five (DMDMD), and seven (DMDMDMD) layer structures were considered, consisting of alternating layers of Al$_2$O$_3$ dielectric and Al metal. The optical constants of Al$_2$O$_3$ were determined experimentally via spectroscopic ellipsometry (SE) of standalone layers deposited via atomic layer deposition (ALD) on HF-cleaned Si substrates [20]. The optical constants of Al were taken from Rakic et al. [21], and the optical constants of Si and quartz (assumed to be equal to SiO$_2$) were taken from Palik [22]. In each case, filter designs were generated in order to yield a peak transmittance at 250 nm, while yielding an average out-of-band transmittance as specified in Table 1.

Only front-surface effects were considered in each case; therefore cumulative absorption and back-surface losses in the case of the transparent MDF may result in additional losses. In this case, the calculation also does not consider additional reflection losses that may occur at the detector, which may be particularly significant for silicon detectors that possess a natural reflectance of more than 60% in the 100-300 nm range.

TABLE 1

Calculated Peak Transmission at 250 nm for MDF Structures Composed of Alternating Layers of Al$_2$O$_3$ and Al on Substrates of Quartz and Silicon for Fixed Amount of Transmission in the Range of 350 to 650 nm

|  | 3 Layer (DMD) | 5 Layer (DMDMD) | 7 Layer (DMDMDMD) |
| --- | --- | --- | --- |
| T$_{avg}$ (350-650 nm) | 10$^{-1}$ | 10$^{-3}$ | 10$^{-5}$ |
| T$_{peak}$ (Si, 250 nm) | 0.86 | 0.67 | 0.50 |
| T$_{peak}$ (quartz, 250 nm) | 0.48 | 0.41 | 0.30 |

Layer optimization was performed by considering only first order dielectric thicknesses while allowing variable Al layer thicknesses in order to match the desired rejection value. Increased Al layer thickness will increase out-of-band rejection at the cost of reduced peak transmission. In the case of the five and seven-layer MDFs, the individual Al layers in the filter were defined as equal to one another in order to simplify the optimization space. Generally, mismatched cavities may be useful to make slight alterations to the shape and width of the passband and the stopband.

Figure 2:
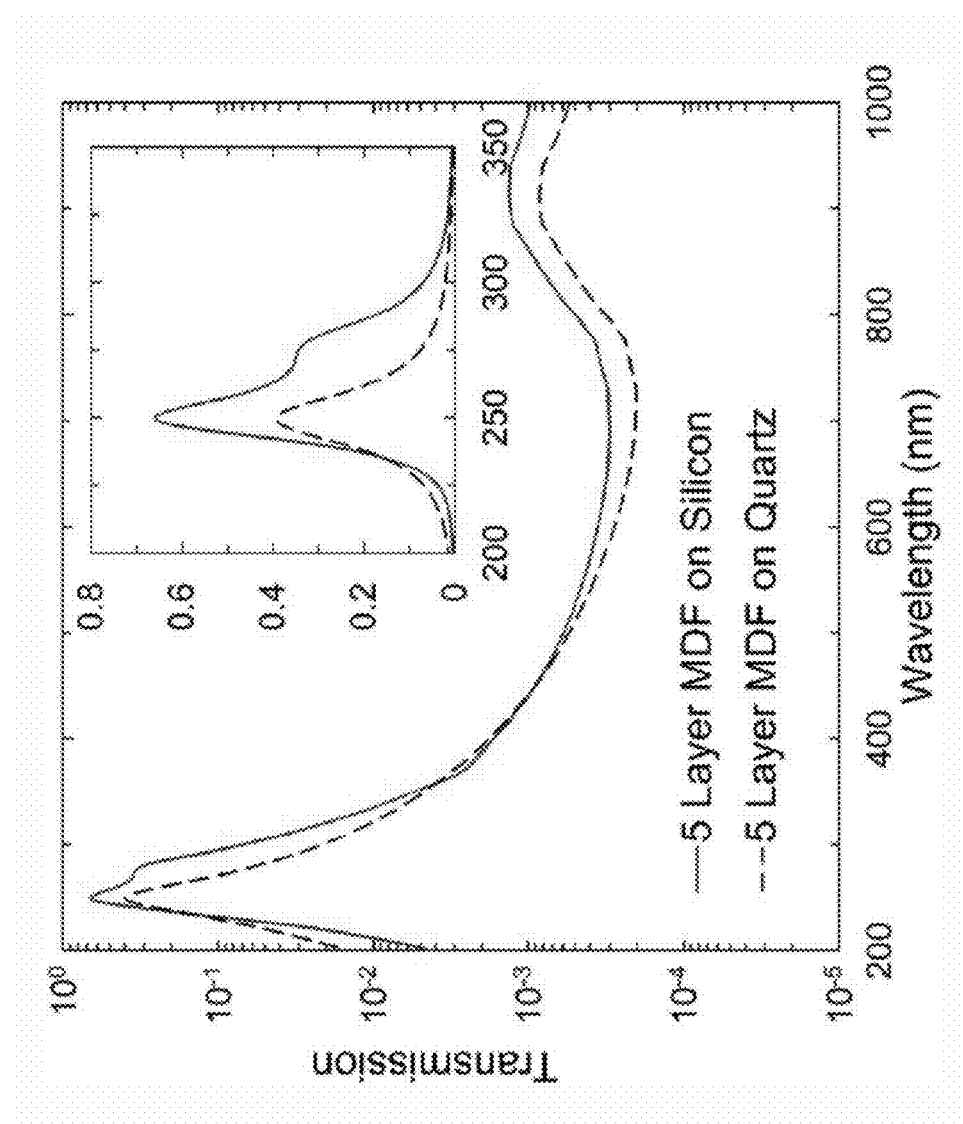
FIG. 2 is calculated performance of a five-layer MDF filter structures described in Table 1 demonstrating the relative performance of structures with similar out-of-band rejection fabricated on silicon (Si) substrates (according to one or more embodiments) or quartz substrates.

As can be seen in Table 1, the optimal Si MDFs offer significant improvement in peak transmittance for a given amount of desired rejection, as highlighted in FIG. 2 which shows the full spectral response for the calculated five-layer structures. This performance improvement is the result of better admittance matching with the metal-dielectric assembly as well as the improved out-of-band reflectivity of Si compared to transparent materials in the visible wavelength range.

Figure 3B:
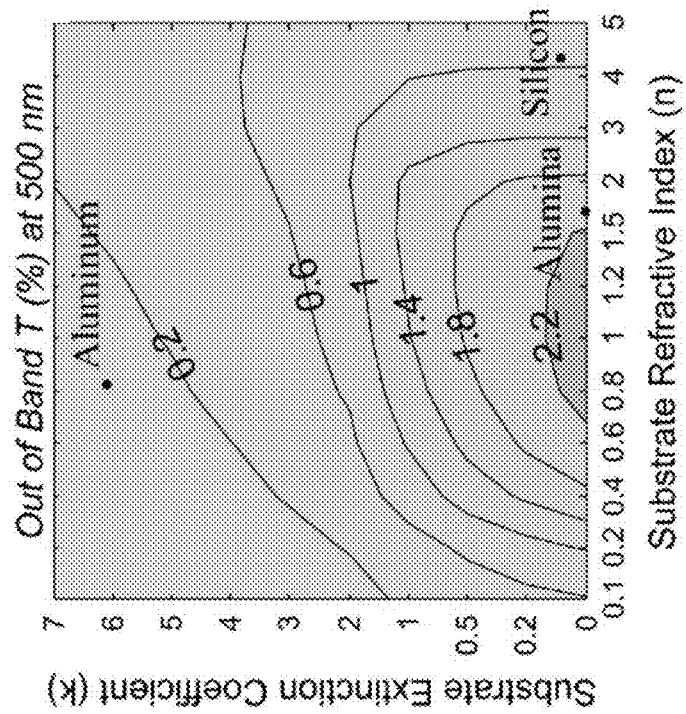
FIG. 3A and FIG. 3B illustrate contours of constant transmission for MDF structures composed of two 10 nm Al layers and dielectric spacers of variable thickness assumed to be aluminum oxide for (FIG. 3A) peak transmission at 250 nm and (FIG. 3B) out-of-band transmission at 500 nm.
Figure 3A:
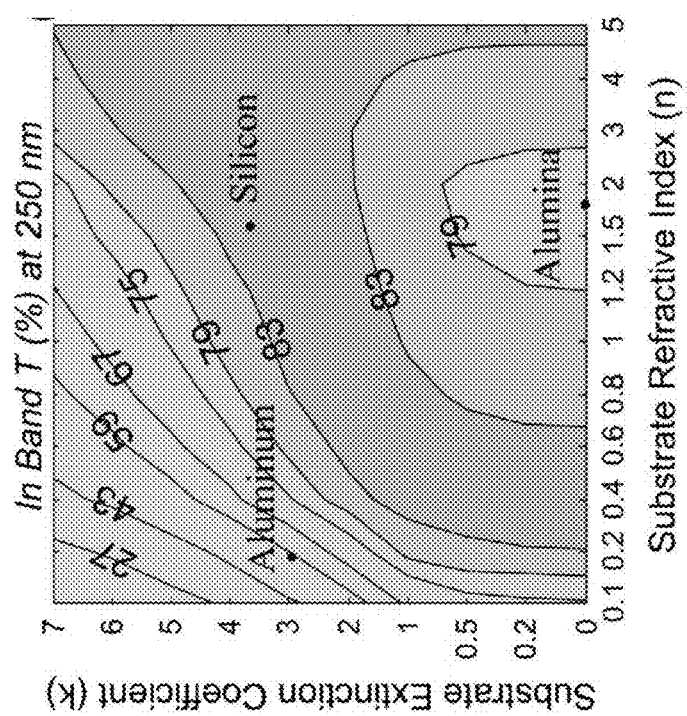

Performance improvement is also summarized in FIG. 3A and FIG. 3B, which show the results of the calculated performance of MDFs composed of two 10 nm Al thin films separated by transparent dielectric (Al$_2$O$_3$) spacers. The impact of the substrate's refractive index and extinction coefficient was evaluated by calculating the transmission of this filter stack in-band at 250 nm and out-of-band at 500 nm. In every calculation, the thicknesses of the dielectric spacer layers were optimized via a simplex algorithm in order to result in maximum possible transmittance at 250 nm. The indices of Si, Al, and the transparent alumina spacer layer are indicated on each plot for the respective target wavelength.

It can be seen in FIG. 3A that there exists a range of real and imaginary refractive indices that yield maximum front-surface transmission for the given structure. Because only front-surface effects were considered in these calculations, the values may vary from the final transmission of a completed element. For example, the calculated transmission on a photosensitive material such as silicon is accurate because the increase in absorption does not imply an additional loss if it is part of the detection process. Likewise, the calculation for transparent materials is accurate because there are no additional losses through the substrate (except for those at the back surface, which can be mitigated).

For materials such as Al, the final transmission may be improved over the calculated values by extending the structure with an additional cavity; however, this final transmission will be necessarily lower than the maximum value represented in FIG. 3A due to finite losses in the metal layers, as well as the requirement to ultimately terminate the structure with either a transparent material or a photosensitive one as described here.

As mentioned previously, the out-of-band rejection of a MDF is determined by the reflectivity of the 'metal' layers, which is supported by the calculations in FIG. 3B that show a significant reduction in transmission at 500 nm for increasing values of k/n. Again, for reflective materials this amount of rejection can be achieved only if the structure is continued with an additional cavity. For transparent substrates the amount of achievable rejection is approximately 100× less than a similar structure with one additional metal layer. This relative improvement is supported by calculated rejection values in Table 1. Although a material such as Si does not match this improvement, it is capable of improving rejection by more than 3× depending on the target wavelengths and desired transmission. When combined with the in-band improvement in transmission, this represents a significant performance increase for the Si MDF over fully transparent implementations.

The Si MDF can then be viewed as a general MDF with one additional mismatched cavity. The added benefit is that this additional cavity does not require a metallic Al layer, whose interface stability represents a significant fabrication challenge, especially for target wavelengths in the far UV. This challenge is the result of the rapid oxidation of the Al surface, which has been observed to degrade the optical properties of Al thin films, even under ultrahigh-vacuum conditions. It is expected that the performance of Al-based MDFs is ultimately limited by the total number of Al layers, each of which provides an interface that may be subject to this degradation.

Experimental Results for Al/Al$_2$O$_3$ Filters According to One or More Embodiments In order to verify the calculated performance of these filter systems, simple test structures were fabricated on bulk silicon substrates with three designs targeting peak transmission at 200, 250, and 300 nm. The dielectric spacer was chosen to be Al$_2$O$_3$, which is transparent in this wavelength range and has an inherent chemical stability with the metallic Al reflector layer. The Al layer thickness was fixed at 15 nm, and the thickness of the remaining dielectric layers was optimized to result in maximized transmission at the target wavelengths. A fixed Al layer thickness was chosen so that the metal layer in each filter structure could be co-deposited. In this way, subsequent optical fitting could be corroborated with this fixed-thickness reference point.

Al$_2$O$_3$ was deposited via atomic layer deposition (ALD) using trimethylaluminum and oxygen plasma at a substrate temperature of 200° C. For future implementations on active Si sensors, ALD is an attractive choice due to its demonstrated efficacy at preserving detector quantum efficiency (QE) in the UV, which is strongly dependent on the electrical quality of the illuminated surface [1]. ALD has been shown to be superior to other dielectric deposition techniques (such as sputtering) at maintaining UV QE [23], and may be effective at preventing additional surface damage during the evaporation or sputtering of subsequent metal layers.

For these structures, the Al layer was evaporated by an electron beam and the thickness was monitored by a quartz crystal microbalance. Al was evaporated at a rate of 2 Å/s at a system base pressure of $2 \times 10^{-9}$ Torr. The chamber pressure was monitored by ion gauge and increased to a range of $8 \times 10^{-9}$ to $1 \times 10^{-8}$ Torr during evaporation. Al$_2$O$_3$ layer thicknesses were calibrated by previous depositions of single-layer thin films on silicon as measured by spectroscopic ellipsometry (SE). No particular precaution was taken to prevent ambient exposure of the evaporated Al films prior to ALD; samples were transferred ex situ.

Initial tests indicate that a finite amount of oxidation of the exposed Al surface occurs prior to, or during, the ALD process; therefore the final structures accounted for this expected offset by increasing the quartz crystal microbalance (QCM) target of the evaporated metal layer by 2 nm, and decreasing the thickness of the top Al$_2$O$_3$ layer by 6 nm. The completed three-layer structures (DMD) were characterized on a Horiba Uvisel 2 spectroscopic ellipsometer at incident angles of 45° and 65° over the range of 1.5 to 6.5 eV. The measured ellipsometric parameters, Is=sin 2Ψ sin 2Δ, and Ic=sin 2Ψ cos 2Δ, were compared to the best fit optical model consisting again of only three layers. As before, the index parameters of the ALD Al$_2$O$_3$ films were determined by SE measurements on stand-alone layers, and the Al parameters were taken from reference spectra.

Attempts to model the index parameters of the encapsulated aluminum layer were not made due to the uncertainty surrounding the amount of oxidation present at the front and back interfaces. Reflectance and SE measurements of thicker Al layers evaporated under similar conditions suggest that the assumed model was representative of the actual deposited layers, and that any uncertainty in interfacial layer thicknesses outweighs changes in the effective refractive index of the metal layer. For the ultrahigh-vacuum conditions used in one or more embodiments of the present invention it is expected that this assumption is valid particularly above the spectral absorption cutoff of aluminum oxide near 200 nm. It was assumed for the purposes of the ellipsometric model that any oxidation that occurs on the front or back Al surface can be treated as optically equivalent to the ALD alumina layers.

Figures 4A, 4B, 4C:
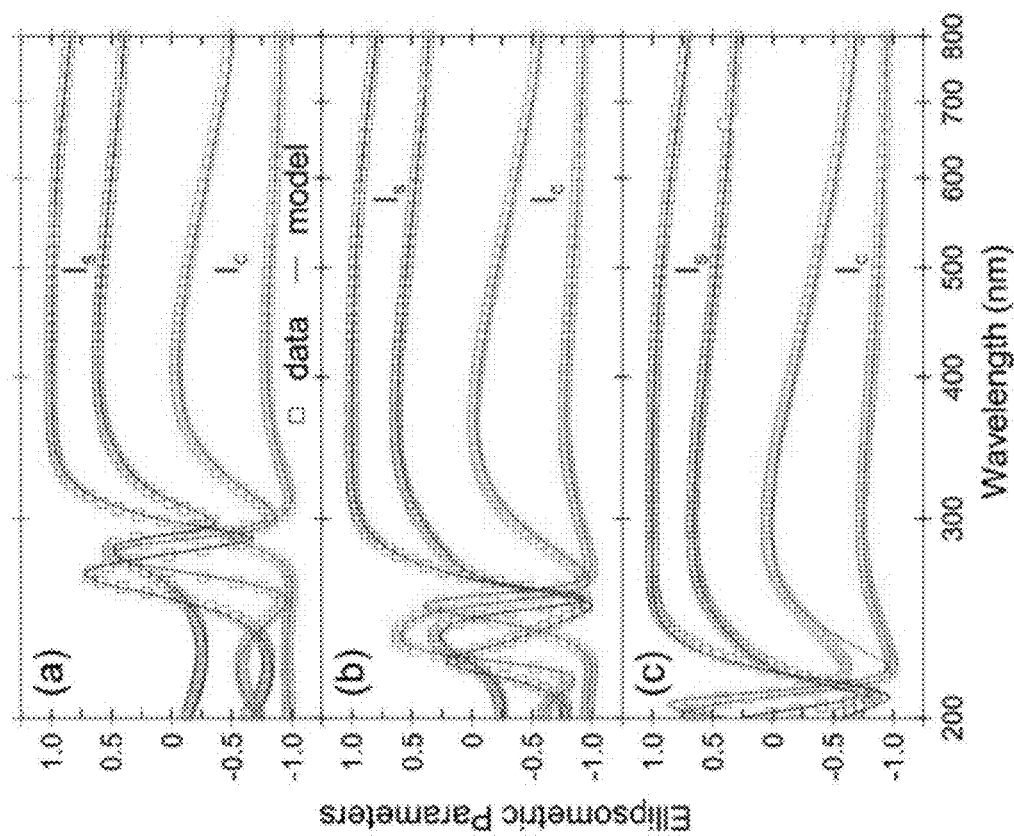
FIG. 4A, FIG. 4B, and FIG. 4C show measured SE parameters for three-layer MDF filter structures at incident angles of 45° and 65° for samples (a)-(c), as described in Table 2.

This assumption appears to be validated by the high quality of the modeled fit to measured ellipsometric data as shown in FIG. 4A, FIG. 4B, and FIG. 4C. The best fit thickness of each layer compared with the original target thickness is given in Table 2 along with the overall $\chi_2$ goodness of fit and the correlation matrix for each layer in the final structure. The overall best fit thicknesses appear to be very similar to the original target thicknesses with a small residual increase in the optical thickness of sample L1, which may be due to some additional oxidation that occurs at the buried Al interface. Although true transmission measurements of these structures require direct integration onto a calibrated sensor, the high quality of the ellipsometric fit suggests that these transmission values will be close to their modeled value, which is plotted in FIG. 5A and FIG. 5B. It is noted that the largest $\chi^2$ difference occurs for sample (c), particularly at wavelengths approaching the expected absorption edge of $Al_2O_3$ (as well as any unintended $AlO_x$ interfacial components). Sample (c) also has the highest projected peak transmission of approximately 90% at normal incidence. A small contribution from higher-order interference is evident in sample (a), which targets a wavelength of 300 nm. When using an $Al_2O_3$ spacer layer, this higher-order peak will continue to become more evident at longer target wavelengths.

For bandpass targets below 200 nm it will be necessary to take more precaution to prevent unintended oxidation of the Al thin films, perhaps by ensuring co-deposition in the same vacuum chamber. As mentioned previously, this can be viewed as another advantage of the Si MDF structure, as the additional mismatched cavity represented by the Si surface forms a more optically and electrically stable interface than metallic Al, particularly for Si sensors that have undergone the delta-doping process.

TABLE 2

Summary of the Test Structure Layers with Physical Thickness Targets and the Refined Targets that Account for Some Oxidation of the Aluminum Layer[a]

| Sample | | ORIG. TARGET (refined) [nm] | BEST FIT [nm] | CORRELATION with [L1 L2 L3] | | |
|---|---|---|---|---|---|---|
| (a) | L1 | 70 | 72.3 | [1 | 0.23 | −0.05] |
| | L2 | 15 (17) | 14.8 | [— | 1 | 0.19] |
| | L3 | 34 (28) | 34.2 | [— | — | 1] |
| | $\chi^2$ | | 3.6 | | | |
| (b) | L1 | 51 | 54.0 | [1 | 0.38 | 0.01] |
| | L2 | 15 (17) | 1.45 | [— | 1 | −0.03] |
| | L3 | 29 (23) | 29.3 | [— | — | 1] |
| | $\chi^2$ | | 4.2 | | | |
| (c) | L1 | 34 | 37.7 | [1 | 0.46 | 0.10] |
| | L2 | 15 (17) | 14.6 | [— | 1 | 0.42] |
| | L3 | 21 (15) | 21.0 | [— | — | 1] |
| | $\chi^2$ | | 17.4 | | | |

[a]The best fit layer thicknesses are shown for the final filters as determined by spectroscopic ellipsometry, along with the resulting correlation matrix for each structure.

Thus, the integration of traditional MDF structures directly onto silicon has been shown to improve performance compared to similar structures on transparent materials. Calculations as well as the fabrication of $Al/Al_2O_3$ experimental structures demonstrate that this performance improvement is due to a combination of improved admittance matching of Al-based MDFs to the silicon substrate and the effective mismatched cavity presented by the substrate, which improves out-of-band rejection.

In the examples disclosed above, MDFs with a single dielectric material are considered; however, other combinations or dielectric materials can be used. Suitable options include $Al_2O_3$ for target UV wavelengths down to its absorption edge at 190 nm, or metal fluorides, such as $MgF_2$, $AlF_3$, or LiF, for applications down to approximately 100 nm. The transparency of the spacer layer is the primary requirement for the performance of the MDF structure; changes in refractive index can be offset by changing the physical thickness in order to create the same phase-matching condition. For example, similar theoretical performance can be predicted for $SiO_2$, $MgF_2$, or $Al_2O_3$, as long as the MDF is operated above the absorption cutoff of the chosen material.

The combination of MDFs with silicon sensors offers the possibility to develop UV detector systems that maintain the high quantum efficiency of silicon, but that also offer high rejection of visible or solar radiation. In this way, back-illuminated Si CCDs, CMOS sensors, or photodiode arrays may be viable alternatives to traditional UV solar-blind detectors such as microchannel plates or photomultiplier tubes.

Detector Integrated Filter Fabrication

In one or more embodiments, the MDF is combined with a photon-counting ultraviolet detector (having high quantum efficiency in the deep ultraviolet). In one or more embodiments, the combination can be used to fabricate an ultrafast scintillator for detecting high energy particles with subnanosecond temporal resolution. The photon-counting detector can comprise an avalanche photodiode (APD) whose performance in the deep ultraviolet is upgraded using surface passivation technology (e.g., superlattice doping).

Figure 6:
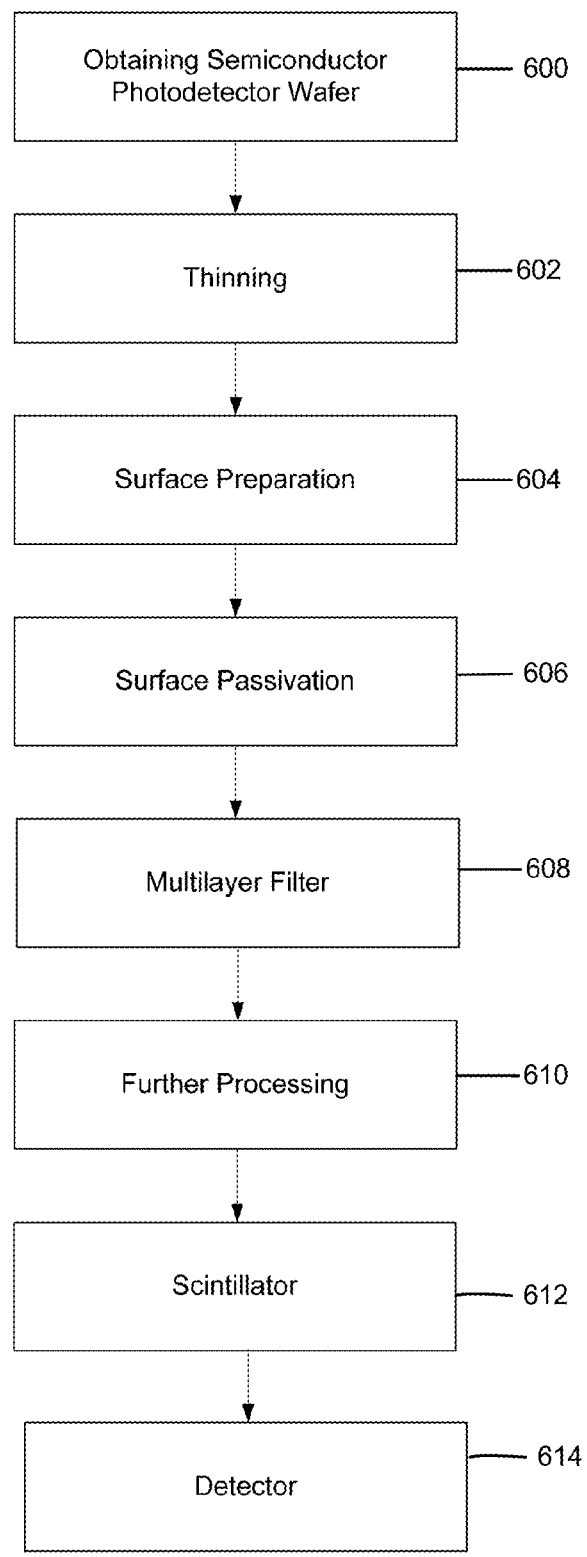
FIG. 6 illustrates a method of fabricating a detector for electromagnetic (EM) radiation, according to one or more embodiments of the invention.

FIG. 6 illustrates a method of combining or integrating the detector with the MDF. The method can comprise the following steps.

Block 600 represents obtaining a semiconductor photodetector (e.g., a wafer). The semiconductor (e.g., silicon) photodetector can comprise a sensor such as a Charge Coupled Device (CCD), Complementary Metal-Oxide-Semiconductor (CMOS) sensor/imaging detector, and a photodiode (e.g., an avalanche photodiode, e.g., operated in a proportional mode, or a multi pixel photon counter module APD). The photodetector can be a detector having built in gain through avalanche multiplication or avalanche gain (e.g., up to 1000 times gain), wherein charge generated in the semiconductor photodetector in response to the ultraviolet radiation is amplified through impact ionization.

Figure 7:
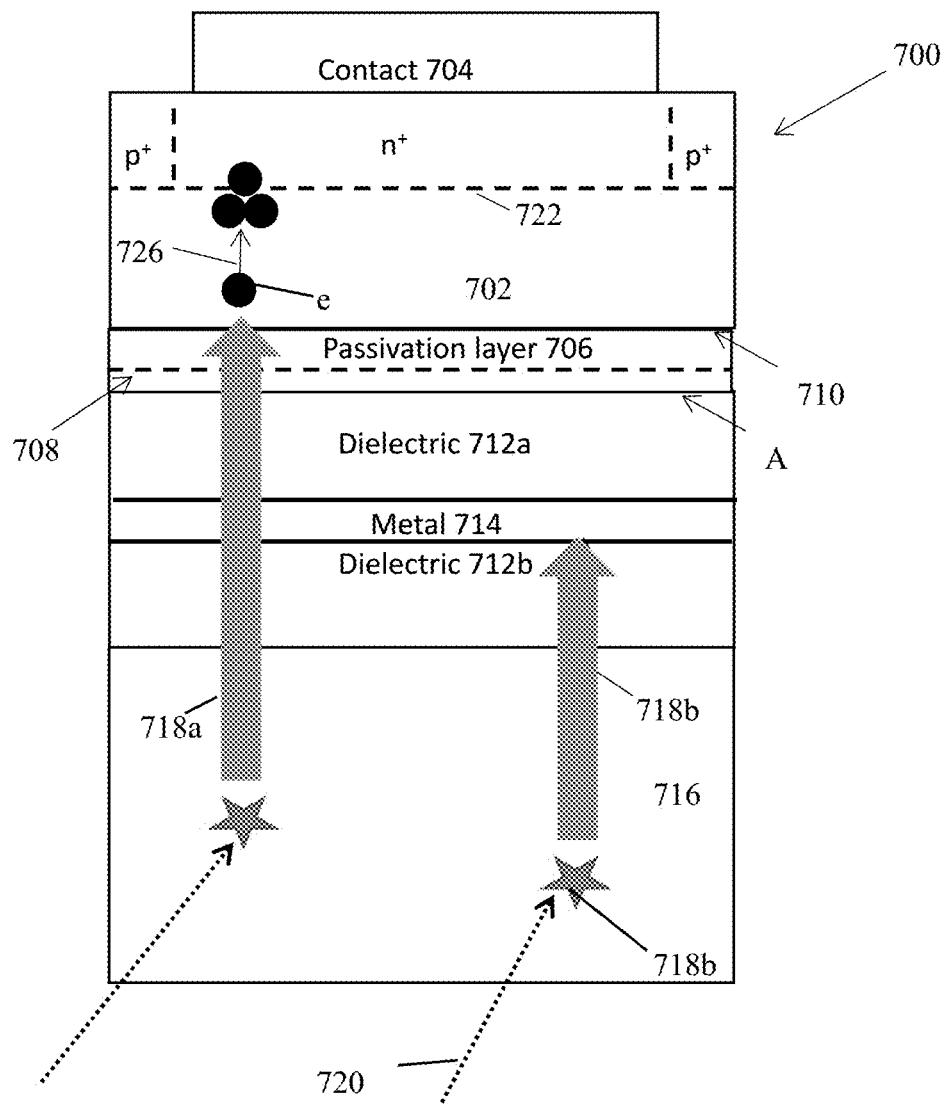
FIG. 7 is a cross-sectional schematic of a detector according to one or more embodiments of the invention.

Block 602 represents thinning the photodetector, e.g., to optimize the depth of the pn junction (e.g., removing 100 micrometers from the p-doped side of the detector). FIG. 7 illustrates the resulting detector 700 can comprise the semiconductor photodetector comprising a photosensitive p$^+$ type silicon epilayer 702 having a thickness of ~5 μm, regions and an n$^+$ region, and n contact 704.

Block 604 represents surface preparation of the thinned surface (e.g., cleaning the surface to be thinned using solutions of bases, acids and oxidizers to remove organic and metallic contamination).

Block 606 represents at least partially passivating the thinned surface area of the semiconductor photodetector, e.g., using surface doping methods to provide a peak quantum efficiency greater than 40% for light with wavelengths corresponding to the desired ultraviolet radiation. The passivation (and thinning and preparation in Blocks 602-604) can use the method and conditions described in [25] (see, for example col. 16 line 63-col. 7 line 52 of [25]).

The passivation can comprise a layer of semiconductor (e.g., silicon) that is doped with a sheet density of at least $10^{14}$ cm$^{-2}$, wherein the passivation layer 708 at least partially passivates the electromagnetic radiation receiving surface area A of the photodetector and is deposited on the thinned side/surface 710 of the photodetector, as illustrated in FIG. 7. The passivation layer 706 can comprise a (e.g., silicon) layer with at one or more doped (e.g., delta-doped) layers 708 (e.g., at least two delta-doped layers, at least 4 delta doped layers). The passivation layer can be deposited by Molecular Beam Epitaxy (MBE), for example. The passivation layer can passivate a density of interface traps ($D_{it}$) greater than $10^{14}$ cm$^{-2}$ eV$^{-1}$.

In one or more embodiments, the passivation layer is typically less than 5 nm thick.

The passivation layer can be configured to be insensitive to radiation-induced surface damage, for example such that there is no change in Quantum Efficiency (QE), to within 5% or within 1%, after irradiation of the passivated surface area A with a billion pulses of the Electromagnetic radiation having an integrated intensity of greater than 2 kilojoules per centimeter square and a wavelength of 193 nanometers (see [27]).

Block 608 represents applying/integrating/forming/combining/depositing one or more dielectric regions/layers 712a, 712b and one or more reflective regions/layers 714 on the passivated surface area A, as illustrated in FIG. 7, to form a photodetector integrated filter acting as a bandpass filter that transmits light/radiation within a range of wavelengths corresponding to ultraviolet radiation and suppresses transmission of light/radiation with wavelengths outside that range of wavelengths.

The dielectric regions can comprise transparent dielectric 712a-712b (e.g., sapphire, $Al_2O_3$) and the reflective regions can comprise dielectric or metal 714 (e.g., Aluminum, Al) to form a Fabry-Perot cavity and/or a photonic bandgap (e.g., a one-dimensional photonic bandgap). The bandpass filter can comprise reflective regions including metal (e.g., Al) embedded in dielectric (e.g., $Al_2O_3$, aluminum oxide) or a multilayer film fabricated from alternating thin films of transparent dielectric layers and reflective metallic layers.

Depending on the target UV wavelength and desired filter properties, the dielectric layers may be composed of any material that is optically transparent in the intended range which may include, for example, $HfO_2$, $Al_2O_3$, $SiO_2$, $MgF_2$, or $AlF_3$. Multilayer stacks of these materials (or others) may also be used to improve the index-matching of the composite dielectric layer. The metallic layer is ideally fabricated from a material with high natural reflectance in the band of interest, for UV applications at wavelengths below 300 nm the most optimal choice is pure aluminum. The final filter structure is deposited directly on the passivated surface A of the detector with a suitable technique that may include atomic layer deposition (ALD) (e.g., using the process described in [26]), chemical vapor deposition, and evaporation among others. In one or more embodiments, the ALD deposition conditions can include using trimethylaluminum and oxygen plasma (or water vapor) at a substrate temperature of 200° C. for the $Al_2O_3$, depositing the Al layers by electron beam evaporation, and monitoring the thickness of the layers using a quartz crystal microbalance. $Al_2O_3$ layer thicknesses can be calibrated by previous depositions of single layer thin films on silicon as measured by spectroscopic ellipsometry, for example.

In one or more embodiments, ALD is used because it can achieve layer by layer growth of the coating/filter with Angstrom level/resolution control over arbitrarily large surface areas, a wide suite of materials can be deposited, such as metals, oxides, and nitrides, with excellent film properties, and the ALD layers can be directly integrated into existing detectors to vastly improve performance. The ALD enables precise, repeatable targeting of desired frequency bands, e.g., using different thicknesses.

In or more embodiments, the MDF comprises a "3 layer" design (one metal layer embedded between two dielectric layers), although other designs are possible. Filter throughput, rejection ratio, bandwidth, and other performance parameters are a functions of the final design which may include multiple periods of the metal-dielectric assembly. Total throughput is ultimately limited by optical absorption losses in the metal layers which may limit the optimal number of periods that can be utilized.

The dielectric layers and metal layer can be dimensioned and structured to destructively phase-match reflection of the ultraviolet radiation off of the reflective regions so as to increase transmission of the ultraviolet radiation through the filter to the semiconductor photodetector, and increase reflection of radiation, having wavelengths outside said range of wavelengths, away from the semiconductor photodetector.

For example, transparency of the dielectric layers to the ultraviolet radiation, a number of the dielectric layers, one or more thicknesses of the dielectric layers, a number of the metal layers, reflectivity of the metal layers, a refractive index of the semiconductor substrate, and an extinction coefficient of the semiconductor substrate, can be selected/controlled/effective to achieve a desired transmittance, e.g., achieving the filter having (for example):

- a transmittance of more than 80%/90% for the ultraviolet radiation at a wavelength of 250 nm and a transmittance of at most 1% for electromagnetic radiation at a wavelength of 500 nm for example (see e.g., FIG. 5A, however, filters with a different peak transmission (higher or lower) at one or more wavelengths different from 250 nm and having suppressed out of band transmittance for a range of wavelengths, can also be designed/provided); and/or
- a higher transmission for the ultraviolet radiation and increased reflectivity of the out of band electromagnetic radiation, having wavelengths outside said range of wavelengths, as compared to a filter comprising the dielectric layers separating two of the metal layers deposited on a transparent (e.g., quartz) substrate; and/or
- measured transmission (in-band and/or out-of band transmission) within 10% of a calculated transmission (in-band and/or out of band transmission) calculated using a simulation of the filters.

The thicknesses of the metal layers and/or the dielectric spacer layers can be adjusted to account for oxidation of one or more of the metal regions. In one more embodiments, the dielectric layers can each have a thickness of 10's nanometers (e.g., in a range of 20-100 nm) and the metal layers can each have a thickness in a range of 5-50 nm.

The dielectric layer could in some implementations comprise multiple layers, or in others it might have a non-homogeneous or graded composition. In some implementations, there might not be a native oxide, although a native oxide between the passivation layer and dielectric 712a is possible (note that a native oxide is an oxide that forms from exposure to air, as opposed to an oxide that is intentionally grown or deposited as part of the structure).

Block 610 represents further processing of the detector and providing electronics or circuitry for processing the detected signal.

Block 612 and represents optionally positioning a scintillator 716 (e.g., coated or glued on the MDF, as illustrated in FIG. 7, or positioned with a gap, such as an air gap, or remote from the photodetector) such that the semiconductor photodetector detects electromagnetic radiation comprising the scintillation 718a-b generated in response to energetic photons or particles 720 incident on the scintillator. In one or more embodiments, the scintillator comprises a $BaF_2$ crystal and/or emits the scintillation including a fast component with a peak wavelength of or near 220 nanometers and a slow component including a wavelength of or near 300 nanometers.

Block 614 represents the end result, a detector useful for detecting ultraviolet radiation or scintillation emitted by a scintillator.

FIG. 7 further illustrates the unwanted out of band component of the radiation (e.g., scintillation 718b, e.g., at 300 nm wavelength) is suppressed by the filter and the desired component of the ultraviolet radiation (e.g., scintillation 718a, e.g., at 220 nm wavelength) is absorbed in the p-type silicon epilayer 702 to photogenerate electrons e⁻. The electrons e⁻ can be transported to the pn junction 722 by diffusion or drift (e.g., with a drift velocity of 10 micrometers per picosecond). A reverse bias applied to the contact 704 with respect to the p-type back side 710 (contacted through the passivation layer) reverse biases (e.g., up to 2000V) the pn junction 722 and creates an electric field 726 that drives the photogenerated electrons e⁻ towards the pn junction at higher speed (e.g., electron transport by electric-field induced drift rather than minority carrier diffusion). When the detector is biased, the electrons e⁻ generate further electrons e⁻ via impact ionization, thereby causing avalanche gain (multiplication) in the pn junction 722. The detected signal can be read out as is done typically for such devices (see e.g., [24]).

A plurality of the detector integrated filters can be fabricated in an array, wherein each detector integrated filter can comprise a pixel or detector element. The electromagnetic radiation receiving surface area A of the detector (and filter) can be at least 1 millimeter (mm) by 1 millimeter, or at least 9 mm by 9 mm, for example.

Device Performance Results

Silicon integration offers typical performance improvements of 3-5 times compared to commercially available stand-alone metal-dielectric UV bandpass filters.

Figure 8:
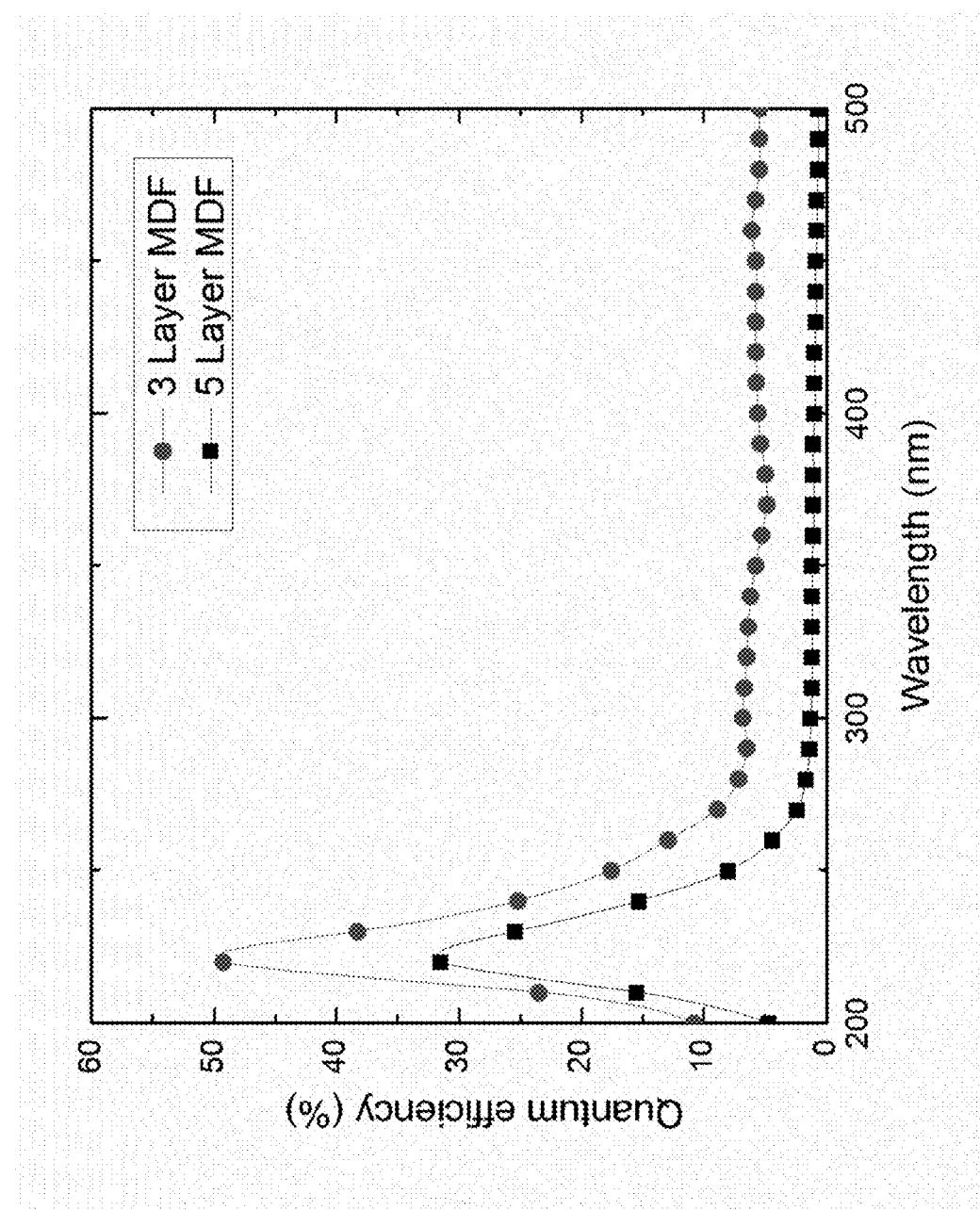
FIG. 8 shows the measured quantum efficiency of superlattice-doped APDs having a 9 mm by 9 mm surface area (area A in FIG. 7) for receiving electromagnetic radiation, for 3 and 5 layer metal-dielectric filters, as a function of wavelength of incident EM radiation in nanometers, fabricated according to one or more embodiments of the invention.
Figure 9:
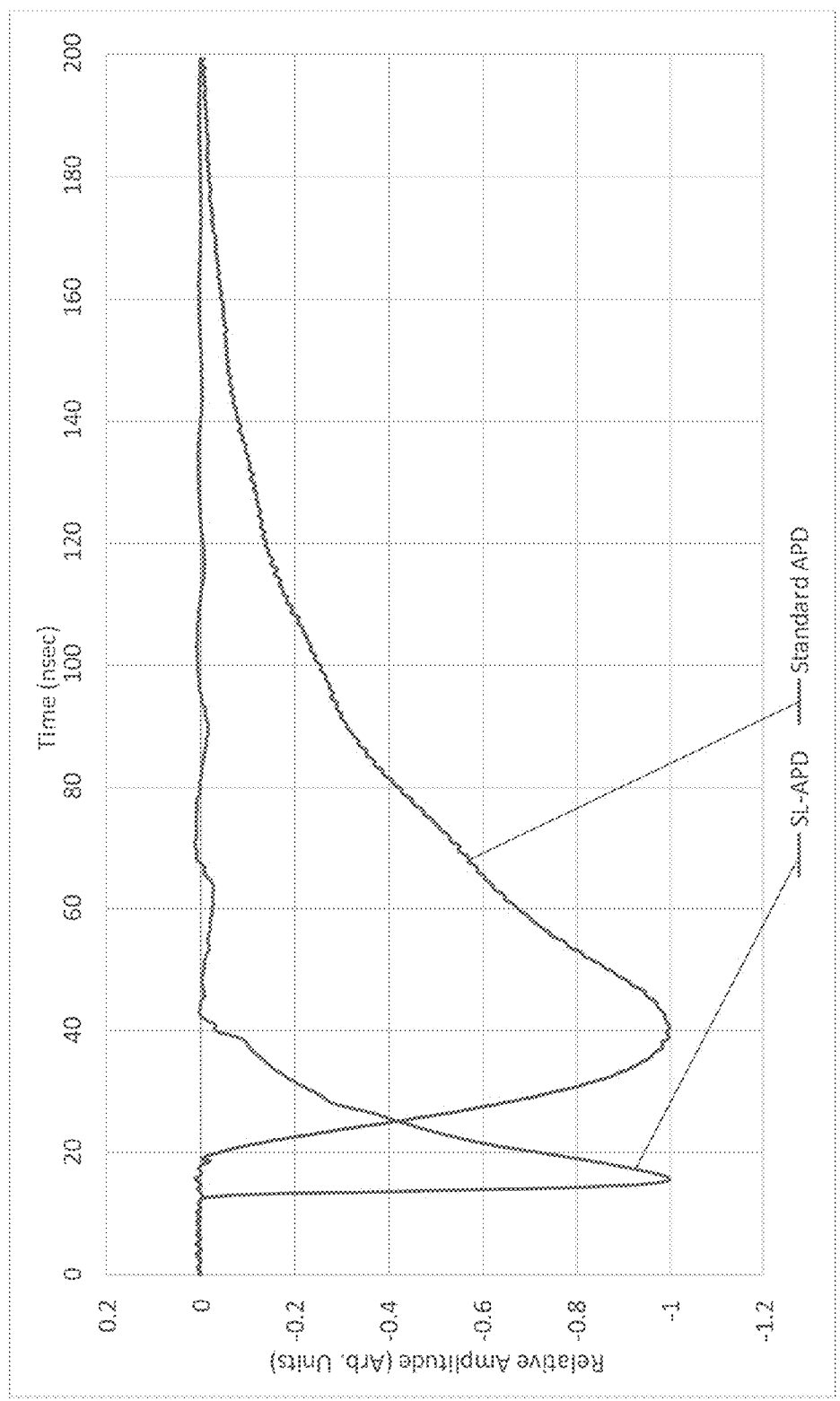
FIG. 9 is comparison of the response times (amplitude of response in arbitrary units versus time in nanoseconds) of a superlattice doped avalanche photodiode (SL-APD) and a conventional, state-of-the-art APD, showing faster response for the SL-APD fabricated according to one or more embodiments of the invention.

FIG. 8 shows the measured quantum efficiency of superlattice-doped APDs with 3 and 5 layer metal-dielectric filters, demonstrating the performance of two different filters on actual devices. FIG. 9 is a comparison of the measured response times of a superlattice doped avalanche photodiode (SL-APD) with filter according to one or more embodiments (based on FIG. 7), and a conventional, state-of-the-art APD. FIG. 9 shows faster response (rise and decay times) for the superlattice doped avalanche photodiode with coating/MDF according to one or more embodiments of the present invention.

For the data obtained in FIG. 8, the underlying device was a Si APD (e.g., as illustrated in FIG. 7) and the approximate layer thicknesses in the MDF were:

5 layer MDF: Si APD/40 nm $Al_2O_3$/20 nm Al/40 nm $Al_2O_3$/10 nm Al/25 nm $Al_2O_3$.

3 layer MDF: Si APD/40 nm $Al_2O_3$/20 nm Al/20 nm $Al_2O_3$.

The top layer thickness (20 & 25 nm in the examples above) is less critical to obtaining the same QE. The metal layer thicknesses can be changed in this range (10-20 nm) to adjust the relative height of the QE peak to the out of band level, and the other $Al_2O_3$ layers (first two in the 5 layer MDF, first one only in the 3 layer MDF) define the wavelength where the QE peak occurs.

For the data in FIGS. 8 and 9, the passivation layer comprises a silicon superlattice with 4 delta doped layers having a combined surface doping density of $8\times10^{14}$ cm$^{-2}$ and a total thickness of less than 5 nm (as illustrated in FIG. 5 of U.S. patent application Ser. No. 14/670,365 filed on Mar. 26, 2015, by Michael E. Hoenk, John Hennessy, and David Hitlin, entitled "SUBNANOSECOND SCINTILLATION DETECTOR, and cross-referenced above).

FIG. 8 shows the peak quantum efficiency of a 5-layer MDF is about 33%, while the peak quantum efficiency for a 3-layer MDF is about 50%. The inventors note that quantum efficiency and transmittance are not the same thing (transmittance is only one of the limiting factors in quantum efficiency). Another factor is recombination of electrons and holes in the semiconductor, which reduces the measured signal from photogenerated charge. Consequently, the quantum efficiency measured in FIG. 8 is necessarily lower than the transmittance of the filter. Moreover, the quantum efficiency in FIG. 8 was measured at low bias voltage so that there would be no gain in the device. Therefore, the data of FIG. 8 really show a lower limit of quantum efficiency as measured under unity gain conditions (i.e., low bias voltage). In the particular device measured in FIG. 8, higher/increased/peak quantum efficiency could be achieved with a high bias voltage (high gain) due to the higher electrical fields produced in the device. Nevertheless, the embodiment of the present invention measured in FIG. 8 achieved relatively high in-band quantum efficiency, and low out-of-band quantum efficiency, which is a remarkable achievement and really illustrates the effectiveness of one or more embodiments of the invention. Better performance is possible by optimization of the device parameters, including the delta-doping/multilayer-doping structure.

In one or more embodiments of the invention, some type of surface passivation will be required, and ultraviolet quantum efficiency will be better with delta-doping. However, the filter will work with other surface passivation technologies.

Positron Emission Scanning Example

Figure 10:
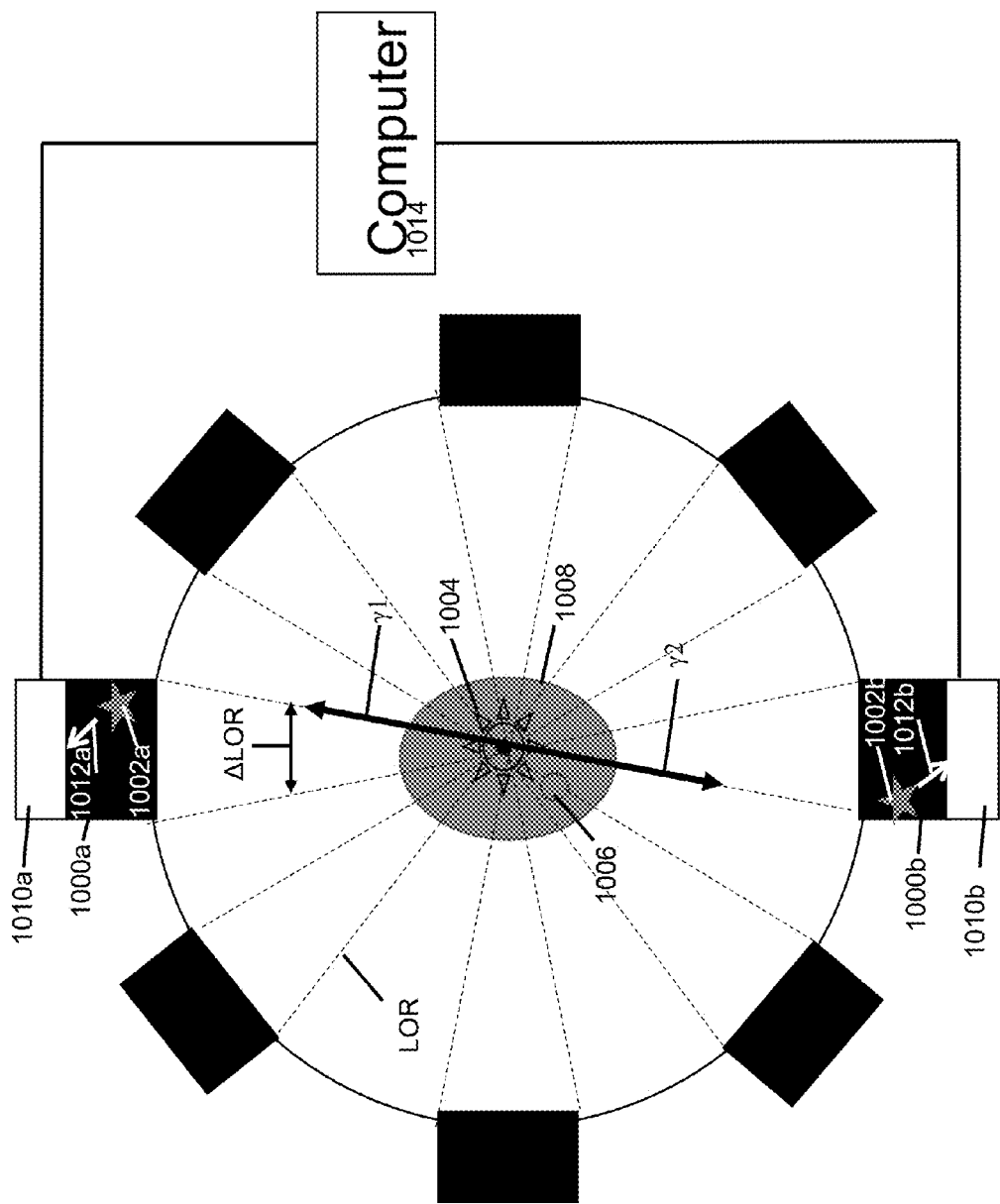
FIG. 10 illustrates a system for performing Positron Emission Tomography (PET) and that can include the detector of FIG. 7.

FIG. 10 illustrates a PET system comprising pairs of scintillators each comprising a first scintillator 1000a and a second scintillator 1000b. The first scintillator 1000a is positioned to receive a first gamma photon γ1 and emit a first scintillation 1002a in response thereto, and the second scintillator 1000b positioned to receive a second gamma photon γ2 and emit a second scintillation 1002b in response thereto. The first and second gamma photons γ1,γ2 are emitted as a pair from an electron-positron annihilation 1004, wherein the positron is emitted by a radionuclide tracer 1006 introduced into a biological cell in a patient 1008. The radionuclide tracer 1006 comprises a positron emitter such as $^{11}C$, $^{13}N$, $^{15}O$, $^{18}F$, or $^{82}Rb$, for example, that undergoes positron emission decay (beta decay), emitting the positron which travels a distance in the patient's 1008 tissue (e.g., less than 1 mm, but dependent on the isotope) before it annihilates 1004 with an electron, producing the pair of gamma photons γ1,γ2 each having 0.511 MeV energy and moving in approximately opposite directions (180 degrees to each other).

The scintillators 1000a-1000b are positioned in a ring around the patient 1008.

The PET system further comprises pairs of detector integrated filters 700 including one of the detector integrated filters 1010a positioned to detect the ultraviolet radiation 1012a comprising the first scintillation 1002a and one of the detector integrated filters 1010b positioned to detect the ultraviolet radiation 1012b comprising the second scintillation 1002b.

The PET system further comprises one or more computers 1014 for performing a (e.g., three dimensional) calculation of a location of the radionuclide tracer 1006. From the gamma photons detected by the scintillators 1000a, 1000b, it is possible to localize their source along a straight line of response (LOR). Thus, the first and second scintillations 1002a, 1002b define a line of response LOR and the intersections of the lines of response LOR are used to determine the location of the radionuclide tracer 1006 (e.g., in two dimensions) with, e.g., a first uncertainty ΔLOR. ΔLOR can represent the uncertainty resulting from the emitted gamma photons not being exactly 180 degrees apart and/or the scintillators having a aperture that can receive photons from different directions.

Possible Modifications and Variations

One drawback of the MDF structure is that the interference repeats at higher orders, allowing additional passbands at shorter wavelengths. This can be combatted by combining with a longpass filter structure when desired, or through the use of spacer layers that become absorbing at higher-energy wavelengths. Another approach is the use of the so-called induced transmission filter, which combines the thin metallic reflectors with dielectrics assemblies as matching layers in order to provide more accurate admittance matching [18]. The metallic layers can also be replaced by dielectric mirrors for all-dielectric implementations. The latter approaches become challenging further into the ultraviolet particularly due to the scarcity of transparent high-index materials for target wavelengths below 200 nm.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

REFERENCES

The following references are incorporated by reference herein.

[1]. M. E. Hoenk, P. J. Grunthaner, F. J. Grunthaner, R. W. Terhune, M. Fattahi, and H.-F. Tseng, "Growth of a delta-doped silicon layer by molecular beam epitaxy on a charge-coupled device for reflection-limited ultraviolet quantum efficiency," Appl. Phys. Lett. 61, 1084-1086 (1992).

[2]. S. Nikzad, M. E. Hoenk, F. Greer, B. Jacquot, S. Monacos, T. J. Jones, J. Blacksberg, E. Hamden, D. Schiminovich, C. Martin, and P. Morrissey, "Delta-doped electron-multiplied CCD with absolute quantum efficiency over 50% in the near to far ultraviolet range for single photon counting applications," Appl. Opt. 51, 365-369 (2012).

[3]. E. T. Hamden, F. Greer, M. E. Hoenk, J. Blacksberg, M. R. Dickie, S. Nikzad, C. Martin, and D. Schiminovich, "UV anti-reflection coatings for use in silicon detector design," Appl. Opt. 50, 4180-4188 (2011).

[4]. B. Bates and D. J. Bradley, "Interference filters for the far ultraviolet (1700 Å to 2400 Å)," Appl. Opt. 5, 971-975 (1966).

[5]. M. Scalora, M. J. Bloemer, A. S. Manka, S. D. Pethel, J. P. Dowling, and C. M. Bowden, "Transparent, metallo-dielectric one dimensional photonic band gap structures," J. Appl. Phys. 83, 2377-2383 (1998).

[6]. K. F. Renk and L. Genzel, "Interference filters and Fabry-Perot interferometers for the far infrared," Appl. Opt. 1, 643-648 (1962).

[7]. M. M. Sigalas, C. T. Chan, K. M. Ho, and C. M. Soukoulis, "Metallic photonic band-gap materials," Phys. Rev. B 52, 11744-11751 (1995).

[8]. A. Piegari and J. Bulir, "Variable narrowband transmission filters with a wide rejection band for spectrometry," Appl. Opt. 45, 3768-3773 (2006).

[9]. M. J. Bloemer and M. Scalora, "Transmissive properties of Ag/MgF2 photonic band gaps," Appl. Phys. Lett. 72, 1676-1678 (1998).

[10]. P. W. Baumeister, V. R. Costich, and S. C. Pieper, "Bandpass filters for the ultraviolet," Appl. Opt. 4, 911-914 (1965).

[11]. Z. Jaksic, M. Maksimovie, and M. Sarajlic, "Silver-silica transparent metal structures as bandpass filters for the ultraviolet range," J. Opt. A 7, 51-55 (2005).

[12]. J. Mu, P.-T. Lin, L. Zhang, J. Michel, L. C. Kimerling, F. Jaworski, and A. Agarwal, "Design and fabrication of a high transmissivity metaldielectric ultraviolet bandpass filter," Appl. Phys. Lett. 102, 213105 (2013).

[13]. T. P. Stecher, G. R. Baker, D. D. Bartoe, F. H. Bauer, A. Blum, R. C. Bohlin, H. R. Butcher, P. C. Chen, N. R. Collins, R. H. Cornett, J. J. Deily, M. R. Greason, G. S. Hennessy, J. K. Hill, R. S. Hill, P. M. Hintzen, J. E. Isensee, P. J. Kenny, W. B. Landsman, D. L. Linard, S. P. Maran, S. G. Neff, G. R. Nichols, J. Novello, R. W. O'Connell, J. D. Offenberg, R. A. Parise, B. B. Pfarr, T. B. Plummer, F. F. Richardson, M. S. Roberts, S. D. Sitko, A. M. Smith, A. K. Stober, J. D. Stolarik, and J. C. Tebay, "The ultraviolet imaging telescope: design and performance," Astrophys. J. 395, L1-L4 (1992).

[14]. J. T. Trauger, "Sensors for the Hubble Space Telescope wide field and planetary cameras (1 and 2)," CCDs in Astronomy 8, 217-230 (1990).

[15]. P. W. A. Roming, T. E. Kennedy, K. O. Mason, J. A. Nousek, L. Ahr, R. E. Bingham, P. S. Broos, M. J. Carter, B. K. Hancock, H. E. Huckle, S. D. Hunsberger, H. Kawakami, R. Killough, T. S. Koch, M. K. McLelland, K. Smith, P. J. Smith, J. C. Soto, P. T. Boyd, A. A. Breeveld, S. T. Holland, M. Ivanushkina, M. S. Pryzby, M. D. Still, and J. Stock, "The swift ultra-violet/optical telescope," Space Sci. Rev. 120, 95-142 (2005).

[16]. P. L. Lim, M. Quijada, S. Baggett, J. Biretta, J. MacKenty, R. Boucarut, S. Rice, and J. del Hoyo, "WFPC2 filters after 16 years on orbit," Bull. Am. Astron. Soc. 43 (2011).

[17]. L. Frey, P. Parrein, J. Raby, C. Pelle, D. Herault, M. Marty, and J. Michailos, "Color filters including infrared cut-off integrated on CMOS image sensor," Opt. Express 19, 13073-13080 (2011).

[18]. P. H. Berning and A. F. Turner, "Induced transmission in absorbing films applied to band pass filter design," J. Opt. Soc. Am. 47, 230-239 (1957).

[19]. "TFCalc: Thin Film Design Software for Windows," Version 3.5, Software Spectra, Inc. (2009).

[20]. A. D. Jewell, J. Hennessy, M. E. Hoenk, and S. Nikzad, "Wide band antireflection coatings deposited by atomic layer deposition," Proc. SPIE 8820, 88200Z (2013).

[21]. A. D. Rakic, A. B. Djurisic, J. M. Elazar, and M. L. Majewski, "Optical properties of metallic films for vertical-cavity opto-electronic devices," Appl. Opt. 37, 5271-5283 (1998).

[22]. E. D. Palik, Handbook of Optical Constants of Solids III (Academic, 1998).

[23]. F. Greer, E. Hamden, B. C. Jacquot, M. E. Hoenk, T. J. Jones, M. R. Dickie, S. P. Monacos, and S. Nikzad, "Atomically precise surface engineering of silicon CCDs for enhanced UV quantum efficiency," J. Vac. Sci. Technol. A 31, 01A103 (2013).

[24]. Hamamatsu brochure for MPPC Modules, Selection guide—January 2014.

[25]. U.S. Pat. No. 8,395,243 by Michael E. Hoenk. et. al.

[26]. U.S. Pat. No. 8,680,637 by Michael E. Hoenk et. al.

[27]. M. E. Hoenk, S. Nikzad, A. G. Carver, T. J. Jones, J. Hennessy, A. D. Jewell, J. Sgro, S. Tsur, M. McClish, R. Farrell, "Superlattice-doped imaging detectors: progress and prospects," *Proc. SPIE*. 9154, High Energy, Optical, and Infrared Detectors for Astronomy VI, 915413. (Jul. 30, 2014) Montreal, Canada, Jun. 24, 2014.

What is claimed is:

1. One or more filters for electromagnetic radiation, each of the filters comprising:
a silicon surface of a silicon photodetector; and
a multilayer stack on the silicon surface, the multilayer stack including a metal layer separating a first dielectric spacer layer and a second dielectric layer, the first dielectric spacer layer directly on the silicon surface, wherein:
the multilayer stack forms a mismatched cavity comprising the silicon surface separated from the metal layer, and
the dielectric layers, the metal layer having a plasma frequency, and the silicon surface:
transmit ultraviolet radiation to the semiconductor photodetector, the ultraviolet radiation having a range of wavelengths, and
suppress transmission of out-of-band electromagnetic radiation, having wavelengths outside the range of wavelengths, to the semiconductor photodetector.

2. The filters of claim 1, wherein the range of wavelengths is 100 nm-300 nm and the wavelengths outside the range of wavelengths include wavelengths corresponding to visible light and infrared radiation.

3. The filters of claim 1, wherein:
the dielectric layers are selected from materials transparent to the ultraviolet radiation the dielectric layers have one or more thicknesses, and the metal layer has a thickness and composition, such that the filters have a a transmission of at least 50% or a maximum transmission for the wavelength range desired for a given ratio relative to transmission for wavelengths outside this range.

4. The filters of claim 1, wherein:
transparency of the dielectric layers to the ultraviolet radiation, one or more thicknesses of the dielectric layers, and
reflectivity of the metal layer, are effective to achieve each of the filters having:
higher transmission for the ultraviolet radiation, and
increased reflectivity of the out-of-band electromagnetic radiation,
as compared to a filter comprising the metal layer separating the first and second dielectric layers and deposited on a quartz substrate.

5. The filters of claim 1, wherein:
measured transmission of the ultraviolet radiation and the out-of-band electromagnetic radiation by each of the filters is within 10% of a calculated transmission of the ultraviolet radiation and the out-of-band electromagnetic radiation, the calculated transmission calculated using a simulation of one or more of the filters.

6. The filters of claim 1, wherein:
thicknesses of the dielectric layers and the metal layer are adjusted to account for oxidation of one or more of the layers.

7. The filters of claim 1, wherein:
the cavities are Fabry-Perot cavities, and
the metal layer, the dielectric layers, and the silicon surface:
destructively phase-match reflection of the ultraviolet radiation so as to increase transmission of the ultraviolet radiation to the semiconductor photodetector, and
increase reflection of the out-of-band electromagnetic radiation away from the semiconductor photodetector.

8. The filters of claim 7, wherein the dielectric layers comprise at least one dielectric selected from hafnium oxide, aluminum oxide, silicon dioxide, aluminum fluoride, and magnesium fluoride, and the metal layer comprise aluminum or a dielectric that reflects the out-of-band electromagnetic radiation.

9. The filters of claim 1, further comprising:
a second metal layer separating a third dielectric layer and the second dielectric layer.

10. The filters of claim 9, wherein the dielectric layers each have a thickness in a range of 20-100 nm and the metal layers each have a thickness in a range of 5-50 nm.

11. The filters of claim 9, further comprising a third metal layer on the third dielectric layer and separating the third dielectric spacer layer from a fourth dielectric spacer layer.

12. The filters of claim 1, wherein the semiconductor photodetector is at least one detector chosen from an avalanche photodiode (APD), CCD, CMOS imaging detector, and a silicon photodiode.

13. The filters of claim 1, wherein:
the semiconductor photodetector has a passivation layer comprising one or more delta doped layers configured to provide the semiconductor photodetector having a peak quantum efficiency greater than 40% for the ultraviolet radiation.

14. The filters of claim 1, further comprising a scintillator electromagnetically coupled to each of the filters, wherein the scintillators each emit scintillation comprising the ultraviolet radiation in response to interactions with energetic photons or particles.

15. A system for performing Positron Emission Tomography (PET) comprising the filters of claim 1, further comprising:
pairs of scintillators each comprising a first scintillator and a second scintillator, the first scintillator positioned to receive a first gamma photon and emit a first scintillation in response thereto, the second scintillator positioned to receive a second gamma photon and emit a second scintillation in response thereto, the first and second gamma photons emitted as a pair from an electron-positron annihilation, and the positron emitted by a radionuclide tracer introduced into a biological cell; and
pairs of the filters, comprising a first filter and a second filter, the first filter positioned to receive the first scintillation and the second filter positioned to receive the second scintillation.

16. The filters of claim 1, wherein the filters each further comprise a longpass filter that reduces transmission of wavelengths shorter than 100 nm.

17. The filters of claim 1, wherein:
the metal layer comprises aluminum and has a thickness in a range of 5-50 nm, and the dielectric layers comprise $Al_2O_3$ and each have a thickness in a range of 20-100 nm.

18. A method of fabricating a filter for electromagnetic radiation, comprising:

depositing a multilayer stack on a silicon surface of a silicon photodetector, the multilayer stack including a metal layer separating a first dielectric spacer layer and a second dielectric layer, wherein:

the multilayer stack forms a mismatched cavity comprising the silicon surface separated from the metal layer, and the dielectric layers, the metal layer having a plasma frequency, and the silicon surface:

transmit ultraviolet radiation to the semiconductor photodetector, the ultraviolet radiation having a range of wavelengths, and suppress transmission of out-of-band electromagnetic radiation, having wavelengths outside the range of wavelengths, to the semiconductor photodetector.

19. The method of claim 18, wherein the depositing comprises atomic layer deposition under growth conditions controlling a number of alternating chemical exposures so as to afford more precise control over thickness, uniformity, and repeatability such that:

wherein:

measured transmission of the ultraviolet radiation and the out-of-band electromagnetic radiation by the filters is within 10% of a calculated transmission of the electromagnetic radiation and the out of band electromagnetic radiation, the calculated transmission calculated using a simulation of the filters.

20. A filter for electromagnetic radiation, comprising:

first and second dielectric layers separated by a metal layer, the first dielectric layer directly on a semiconductor surface of a semiconductor substrate, such that:

the filter transmits ultraviolet radiation to the semiconductor substrate, the ultraviolet radiation having a range of wavelengths, and the filter suppresses transmission of out-of-band electromagnetic radiation, having wavelengths outside the range of wavelengths, to the semiconductor substrate.

* * * * *